(12) United States Patent
Bruins et al.

(10) Patent No.: US 9,612,264 B2
(45) Date of Patent: Apr. 4, 2017

(54) UNMANNED AERIAL DEVICE AND METHOD FOR PERFORMING A LIGHTNING PROTECTION MEASUREMENT AT A WIND TURBINE

(71) Applicant: Availon GmbH, Rheine (DE)

(72) Inventors: Marcel Bruins, Almelo (NL); Jochen Holling, Wettringen (DE)

(73) Assignee: Availon GmbH, Rheine (DE)

( * ) Notice: Subject to any disclaimer, the term of this patent is extended or adjusted under 35 U.S.C. 154(b) by 8 days.

(21) Appl. No.: 14/824,958

(22) Filed: Aug. 12, 2015

(65) Prior Publication Data
US 2016/0047850 A1    Feb. 18, 2016

(30) Foreign Application Priority Data
Aug. 14, 2014   (DE) .................... 20 2014 006 541 U

(51) Int. Cl.
*G01R 27/08* (2006.01)
*F03D 1/00* (2006.01)
(Continued)

(52) U.S. Cl.
CPC ............ *G01R 27/08* (2013.01); *F03D 1/003* (2013.01); *F03D 17/00* (2016.05); *F03D 80/00* (2016.05); *F03D 80/30* (2016.05); *G01R 1/067* (2013.01); *G01R 31/282* (2013.01); *B64C 2201/027* (2013.01); *B64C 2201/126* (2013.01); *B64C 2201/127* (2013.01); *F05B 2260/80* (2013.01);
(Continued)

(58) Field of Classification Search
CPC combination set(s) only.
See application file for complete search history.

(56) References Cited

U.S. PATENT DOCUMENTS 4,904,996 A    2/1990  Fernandes
8,584,355 B2  11/2013  Holling
(Continued)

FOREIGN PATENT DOCUMENTS

CN          102879692 A  *  1/2013  ............. G01R 31/00
DE    10 2007 027 849 A1  12/2008
(Continued)

OTHER PUBLICATIONS

Extended European Search Report, dated Dec. 2, 2015, of the corresponding European Application No. 15180146.1. (7 pages).

*Primary Examiner* — Clayton E Laballe
*Assistant Examiner* — Jas Sanghera
(74) *Attorney, Agent, or Firm* — Wood Herron & Evans LLP

(57) ABSTRACT

The invention relates to an unmanned aerial device for performing a resistance, current and/or voltage measurement at an object, in particular a lightning protection measurement at a wind turbine, comprising a contact element with an electrically conductive contact area, which can be brought into contact with a surface of the object, in particular with a lightning protection receptor of a rotor blade, of a nacelle or of a tower of a wind turbine, and comprising an electrically conductive measurement cable, which, with a first end, is connected in an electrically conductive manner to the contact area, and, with a second end, can be connected to a resistance, current and/or voltage measuring device and/or a grounding contact of the object.

20 Claims, 4 Drawing Sheets

Figure 1:
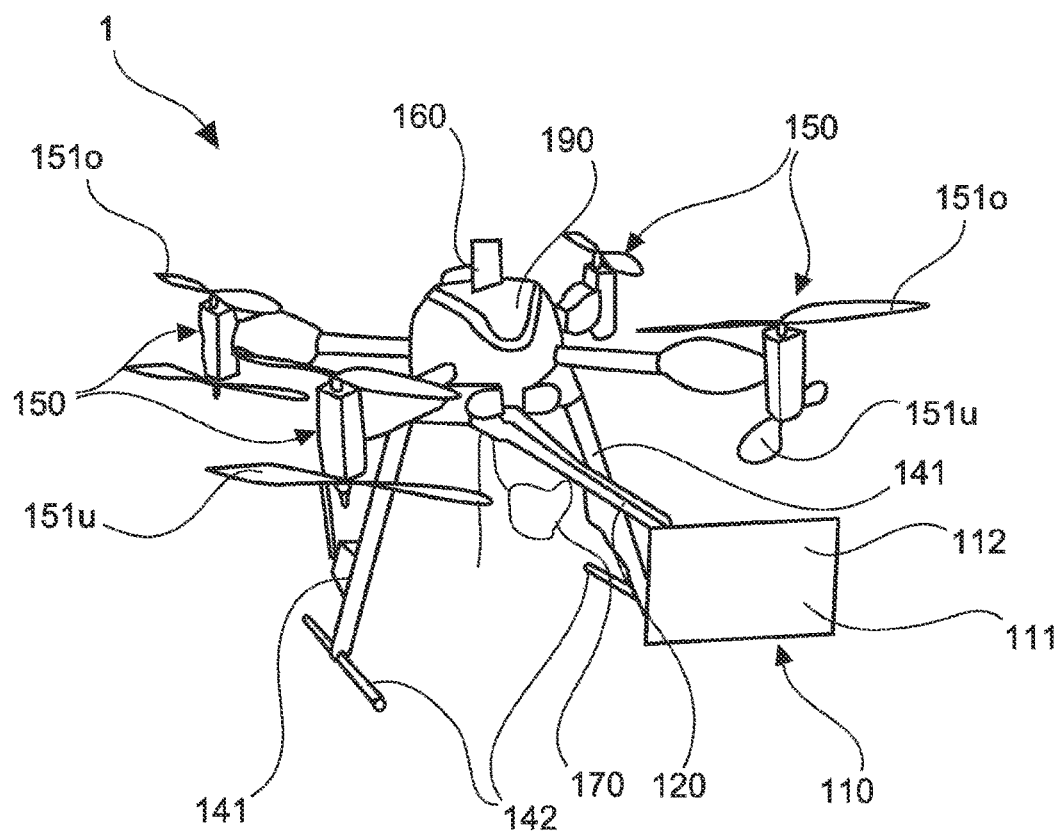

(51) Int. Cl.
  *G01R 31/28*   (2006.01)
  *G01R 1/067*   (2006.01)
  *F03D 80/00*   (2016.01)
  *F03D 80/30*   (2016.01)
  *F03D 17/00*   (2016.01)

(52) U.S. Cl.
  CPC ... *F05B 2260/83* (2013.01); *F05B 2270/8041* (2013.01); *Y02E 10/721* (2013.01)

(56) References Cited

U.S. PATENT DOCUMENTS

| | | |
|---|---|---|
| 8,936,437 B2 | 1/2015 | Holling et al. |
| 2010/0183440 A1 | 7/2010 | Von Mutius et al. |
| 2012/0136630 A1* | 5/2012 | Murphy ............... F03D 1/003 702/188 |
| 2014/0168420 A1 | 6/2014 | Naderhirn et al. |

FOREIGN PATENT DOCUMENTS

| | | | |
|---|---|---|---|
| DE | 10 2011 017 564 A1 | 10/2012 | |
| DE | 10 2011 077 613 A1 | 12/2012 | |
| DE | 10 2013 207 322 A1 | 10/2014 | |
| DE | 10 2013 216 096 A1 | 2/2015 | |
| EP | 2 003 057 A2 | 12/2008 | |
| FR | WO 2012013878 A1 * | 2/2012 | ........... B64C 39/024 |

* cited by examiner

UNMANNED AERIAL DEVICE AND METHOD FOR PERFORMING A LIGHTNING PROTECTION MEASUREMENT AT A WIND TURBINE

This application claims priority to German Patent Application No. 202014006541.1, filed Aug. 14, 2014, the disclosure of which is incorporated by reference herein.

The invention relates to an unmanned aerial device for performing a resistance, current and/or voltage measurement at an object, in particular a lightning protection measurement at a wind turbine. Furthermore, the invention relates to a method for performing a resistance, current and/or voltage measurement at an object, in particular a lightning protection measurement at a wind turbine.

In most cases, wind turbines comprise a tower, a nacelle installed on the tower in a swivelable manner, a drive train arranged in the nacelle and a rotor driving the drive train and comprising a hub and at least one, in most cases, three rotor blades arranged at the hub in a swivelable manner. In most cases, receptors for inducing a lightning current are distributed at the wind turbine. Especially the rotor blades, the rotor blade tips in particular, and/or the area of the roof of the nacelle often comprise such a receptor.

In order to achieve a higher efficiency, wind turbines are often set up in exposed positions in open areas. For this reason and due to their size, they are subject to a high risk of being struck by lightning. Lightning rod installations are to ensure that a lightning current is safely conducted to the ground without damaging or impacting the wind turbine. To this end, the previously mentioned receptors are, in most cases, grounded via grounding contacts, for which e.g. lightning protection cables and/or grounding cables are connected to a grounding anchor inserted into the ground, which is also referred to as the grounding lug at the base of the tower.

Lightning protection installations of wind turbines and other objects must be maintained at a regular basis in order to ensure their functioning in case of a lightning strike, as is, for example, described in DE 10 2007 027 849 A1. Usually, to this end, a maintenance current is sent through a lightning protection cable between receptors and the grounding contact and its ohm resistance is measured for example via a voltage drop. Alternatively, a current through the lightning protection cable can be measured. For the performance of such a lightning protection measurement, a maintenance cable is usually clamped to the outside of a receptor. This is, for example, performed by an industrial climber abseiling from the nacelle or by maintenance employees who are let down in an aerial lift cage by a crane. Working platforms let down from a crane or the nacelle may be used as well. The other end of the maintenance cable is usually connected to a section of the lightning protection cable running inside the nacelle or with the grounding lug at the base of the tower, through which a maintenance circuit is created, which is tested for continuity and evaluated by means of a respective measuring device. Various methods and devices for the performance of lightning protection measurements, at wind turbines in particular, are known for example from DE 10 2005 017 865 B4, DE 10 2009 059 378 A1, DE 10 2012 009 205 A1 or DE 10 2012 214 981.

However, there is a demand for improved devices and methods for performing resistance, current and/or voltage measurements at objects, in particular for performing a lightning protection measurement at a wind turbine, which make it possible to perform such a measurement in a simple, safe and cost-efficient manner.

Therefore, it is an object of the present invention to define a device and a method for performing a resistance, current and/or voltage measurement at an object, in particular a lightning protection measurement at a wind turbine, which, compared to existing devices or respectively methods, are improved, and, in particular, simpler, safer and/or more cost efficient.

This object is achieved through an unmanned aerial device for performing a resistance, current and/or voltage measurement at an object, in particular a lightning protection measurement at a wind turbine, comprising a contact element with an electrically conductive contact area, which can be brought into contact with a surface of the object, in particular with a lightning protection receptor of a rotor blade, of a nacelle or of a tower of a wind turbine, and comprising an electrically conductive measurement cable, which, with a first end, is connected in an electrically conductive manner to the contact area, and, with a second end, can be connected to a resistance, current and/or voltage measuring device and/or a grounding contact of the object.

The invention is based on the insight that an unmanned aerial device can be used in an advantageous manner for performing resistance, current and/or voltage measurements at an object, in particular a lightning protection measurement at a wind turbine. In this context, an unmanned aerial device means, in particular, an aerial vehicle remotely controlled, usually from the ground, which can be operated and navigated without personnel on board of the aerial device, and which, instead, is equipped with respective (remote) control installations. Sometimes such unmanned aerial devices are also referred to as drones. A quadcopter or a flying platform, for example, can be used as unmanned aerial device.

The use of unmanned aerial devices for maintenance purposes is generally known, for example from WO 2013/060693 A2, DE 10 2005 023 796 A1 or U.S. Pat. No. 4,818,990. In the area of wind turbines as well, unmanned aerial devices are used for maintenance purposes, for example in WO 2010/051278 A1, DE 10 2008 053 928 A1, DE 10 2010 048 400 A1 or DE 10 2011 118 833 B3. However, all these existing maintenance devices and methods by means of unmanned aerial objects have in common that they do not establish a contact between the unmanned aerial device and the object or respectively the wind turbine, but that the unmanned aerial device is merely brought into the vicinity of the object or respectively the wind turbine in order to gain information on the condition of the wind turbine by means of image capturing or touchless measurements.

Since, however, the creation of a measurement circuit is required for a lightning protection measurement, the existing devices and methods for the maintenance of objects or respectively wind turbines by unmanned aerial devices are generally not suitable for performing a lightning protection measurement. Instead, it is in fact required in the case of the existing methods and devices that any contact between the unmanned aerial device and an object or a wind turbine be avoided. Contrary to this, the invention is based on the insight that a contact between the aerial device and the object or respectively the wind turbine must be established in order to thus enable the creation of a measurement circuit.

To this end, the unmanned aerial device pursuant to the invention comprises a contact element which is brought into contact with a surface of the object, preferably by means of controlled flying movements of the aerial device. To this end, the contact element comprises an electrically conductive contact area. In the case of a lightning protection measurement for a wind turbine, the contact area of the contact element is preferably brought into contact with a lightning protection receptor which can be arranged in a rotor blade tip, at the roof of the nacelle or in the tower of a wind turbine. An electrically conductive measurement cable is connected in an electrically conductive manner to this electrically conductive contact area. Another end of this measurement cable serves the creation of a measurement circuit and can, to this end, be connected to a grounding contact or a lightning protection cable of the object and/or a resistance, current and/or voltage measuring device. Preferably, the measurement cable is configured sufficiently long for reaching a point on the ground from the intended flight height and distance of the aerial device.

Thus, the unmanned aerial device pursuant to the invention makes it possible to integrate a surface of the object which is usually inaccessible or difficult to access, such as a rotor blade of a wind turbine, through the connection via the contact area and the measurement cable into a measurement circuit, in which, in turn, a lightning protection measurement can be performed by means of a resistance, current and/or voltage measurement. In addition to the connection between the first end of the electrically conductive measurement cable and the electrically conductive contact area, the second end of the measurement cable must be connected to the measuring device and/or to a grounding contact of the object, which, for example, may be the grounding lug at the base of the tower or also a part of the lighting protection line in the wind turbine, such as the equipotential bonding system in the nacelle or a spark gap, if the conduction to the nacelle is realized via a spark gap. Through such a closing of the measurement circuit by means of the measurement cable connected in an electrically conductive manner to the contact area, the use of the unmanned aerial device pursuant to the invention makes a resistance, current and/or voltage measurement possible without requiring a person to establish an electrically conductive connection between the measurement cable and the lightning protection receptor on site, i.e. at the lightning protection receptor.

Preferably, the connection between the measurement cable and the contact area is detachable, just as the connection between the measurement cable and the resistance, current or voltage measuring device and/or the grounding contact of the object. The measurement cable is preferably up to 100 m long or longer, and can, for example, be provided on a drum so that the drum with the second end of the measurement cable remains on the ground and, when the aerial device takes off the ground, the measurement cable is respectively unspooled from the drum.

For the performance of the measurement, the contact between the contact element and the surface of the object is preferably maintained for a pre-determined measurement duration, in particular for at least 2 s, at least 5 s, at least 10 s or at least 20 s. Preferably, the unmanned aerial device is configured to hover at least for the time of the measurement duration, i.e. to be in a flight status in which the aerial device remains in the air in an unchanged position and at an unchanged height.

It may also be provided that, furthermore, the aerial device comprises a resistance, current and/or voltage measuring device connected to the second end of the measurement cable. In this version, the resistance, current and/or voltage measuring device is also arranged at the aerial device and, preferably, can also be controlled remotely. Usually, however, the resistance, current and/or voltage measuring device will remain on the ground and be controlled from there.

A preferred embodiment requires that an image capturing means, preferably a digital or CCD camera, be arranged at the aerial device. The image capturing means transmits data preferably wirelessly to an evaluation and/or output unit on the ground and can preferably also be remotely controlled from the ground. The image capturing means at the aerial device serves, inter alia, for navigation purposes and, in particular, to identify the surface at the object to be contacted, especially to identify the receptors.

In this case, it is, in particular, preferable that the image capturing means be arranged and configured in such a way that it captures the contact element and, preferably, its immediate vicinity, in particular an area between the contact area and the object. The image capturing means will be particularly advantageous if it is able to capture the contact element and its immediate vicinity, such as an area of at least 2 m, preferably 5 m or 10 m, around the contact area and, in particular, if, while the aerial device is approaching the surface of the object to be contacted, it also captures said surface of the object to be contacted.

Another preferred embodiment requires that at least one flight propulsion unit of the aerial device be connected to a first end of an electrical conductor and a second end of the electrical conductor can be connected to a power supply connection. The advantage of such an electrical conductor, which, preferably, can be connected in a detachable manner to the flight propulsion unit and, likewise, can be connected in a detachable manner to a power supply connection, is that the running time and or the performance of the at least one flight propulsion unit of the aerial device can be significantly increased if the flight propulsion unit does not have to be powered (only) by a mobile power supply carried along on the aerial device, but can be connected to the power supply of an electrical grid via the electrical conductor.

It is especially preferable that the connection between the first end of the measurement cable and the contact area, and/or the connection between the second end of the measurement cable and the resistance, current and/or voltage measuring device or respectively the grounding contact of the object, and/or the connection between the first end of the electrical conductor and the at least one flight propulsion unit, and/or the connection between the second end of the electrical conductor and the power supply connection be configured in a detachable manner. First of all, such a detachable connection has the advantage that the connections can be optionally established or severed and, moreover, that they can be quickly severed, for example in case of imminent danger or if the free run of the measurement cable and/or the electrical conductor is impeded.

Furthermore, it is especially preferable that the connection between the first end of the measurement cable and the contact area, and/or the connection between the second end of the measurement cable and the resistance, current and/or voltage measuring device or respectively the grounding contact of the object, and/or the connection between the first end of the electrical conductor and the at least one flight propulsion unit, and/or the connection between the second end of the electrical conductor and the power supply connection be configured in such a way that the connection(s) will be severed if a predetermined tensile force on the measurement cable and/or the electrical conductor is exceeded. In this case, a type of safety connection is provided, which will be severed automatically or disconnects on its own, if a specific tensile force on the measurement cable and/or the electrical conductor occurs. This may, for example, be the case if the measurement cable and/or the electrical conductor are caught in an obstacle or are otherwise blocked and if the aerial device continues its flight or respectively climb and thus exercises a tensile force on the measurement cable and/or the electrical conductor. The tensile force, at which the connection(s) is or respectively are severed, is preferably adapted to a common lifting or respectively propelling force of the aerial device.

Preferred embodiments of the contact element require, for example, that copper wool be arranged on the contact area, which facilitates the creation of an electrically conductive connection between a lightning protection receptor and the contact area. Furthermore, the contact area is preferably arranged vertically and/or configured concavely. Such a configuration can be advantageous in order to establish a contact with vertically arranged, concavely configured surfaces, such as the tower of a wind turbine. The contact element is preferably the element of the aerial device which, in particular in a horizontal direction, is located at the furthest distance from a center of gravity and/or the geometric center of the aerial device.

Another preferred embodiment requires that the contact element is connected to the aerial device via a connection element, which is preferably configured essentially rod-shaped, and wherein the connection element has preferably an essentially horizontal orientation. The connection element can, for example, also be configured as a truss-like structure.

The measurement cable and/or the electrical conductor can advantageously run inside the connection element.

Furthermore, it is preferred that the contact area and/or the contact element be attached to the aerial device or to the connection element in a spring-mounted, movable and/or detachable manner. The contact area and/or the contact element can be attached directly to the aerial device or indirectly, for example via the connection element. A detachable connection is for example preferable in order to make it possible to replace or maintain the contact area and/or the contact element. A movable connection, preferably a connection that can be switched from a movable to a fixed position, can be preferable in order to make it even easier to reach the surface to be contacted. A mechanism, where the aerial device is kept hovering in a position where the contact area is already closely in front of the surface of the object to be contacted and where the contact element with the contact area is subsequently moved towards the object for example by means of a telescope-like extension of the connection element in order to establish the contact, may, for example, be preferable. Furthermore, a spring-mounted attachment of the contact area and/or the contact element is preferred in order to avoid damage to the contact area, the contact element, the aerial device and/or the object.

Furthermore, an embodiment in which the connection element is attached to the aerial device in a spring-mounted, movable and/or detachable manner is preferred. The connection element as well can be attached directly to the aerial device or indirectly via other intermediate elements. The connection element may, for example, also be configured as a rod that can be extended in a telescope-like manner and may comprise a spring element or a shock absorber for a cushioned attachment. The advantages of a spring-mounted, movable and/or detachable attachment to the aerial device with regard to the connection element are similar to the ones for the contact area or respectively the contact element.

Another preferred embodiment results, in particular, from an arrangement and configuration of the image capturing means in such a way that it captures the contact element in a viewing direction essentially in the direction of the connection element or parallel to it. This embodiment has the advantage that the contact element approaching the surface of the object to be contacted can be captured easily by the image capturing means so that it can be made easier for a pilot controlling the aerial device by remote control to navigate the aerial device so that it contacts the surface of the object to be contacted by means of the contact area.

Pursuant to another aspect of the invention, the above mentioned object is achieved through a method for performing a resistance, current and/or voltage measurement at an object, in particular a lightning protection measurement at a wind turbine, comprising providing an unmanned aerial device in accordance with at least one of the previous claims, connecting the second end of the measurement cable to a resistance, current and/or voltage measuring device and/or to an grounding contact of the object, contacting a surface of the object, in particular of a lightning protection receptor of a rotor blade, of a nacelle or of a tower of a wind turbine, with the contact area of the contact element by means of controlled flying movements of the aerial device, maintaining the contact between the contact area of the contact element and the surface of the object for a predetermined measurement duration, preferably by a hovering of the aerial device, measuring a resistance, a current and/or a voltage, preferably by means of the resistance, current and/or voltage measuring device.

The resistance, current and/or voltage measurement is preferably performed in the electric circuit between the lightning protection receptor and a grounding lug at the base of the tower by means of the resistance, current and/or voltage measuring device. The method pursuant to the invention and its possible realizations comprise features or respectively method steps which make it, in particular, suitable for being used together with an aerial device pursuant to the invention and its embodiments.

Regarding the advantages, possible versions and realization details of the method pursuant to the invention and its realizations, reference is therefore made to the previous description of the respective features of the aerial device.

Figure 2:
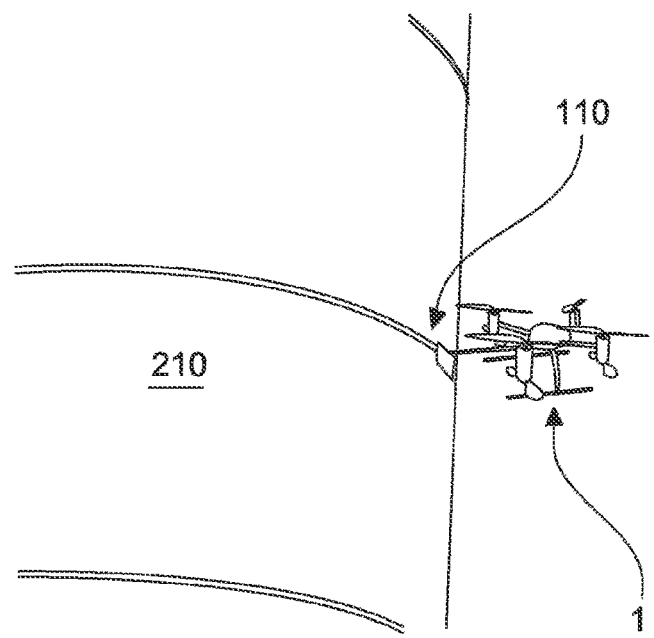
Figure 3:
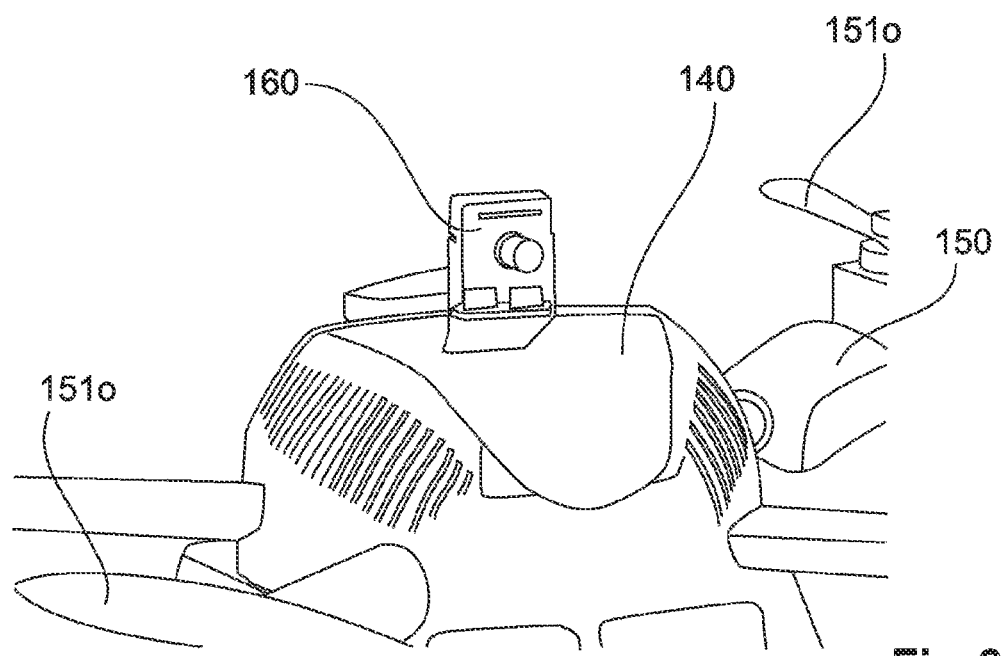
Figure 4:
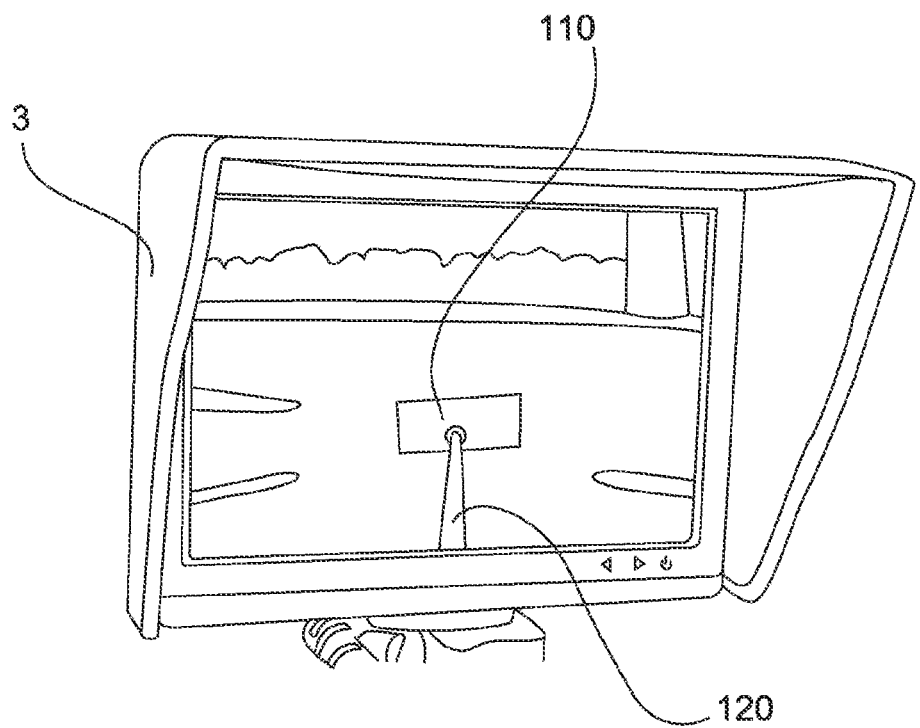
Figure 5:
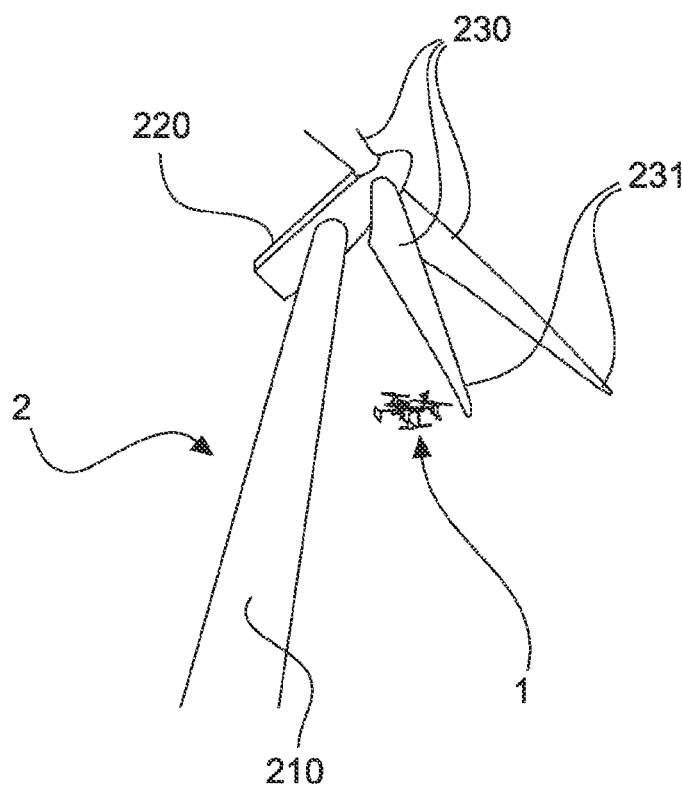
Figure 6:
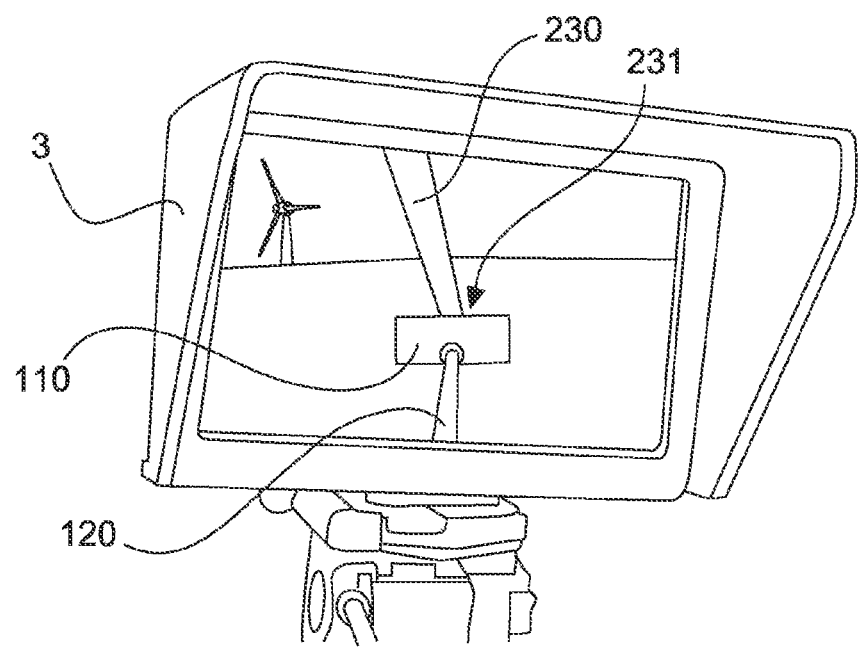
Figure 7:
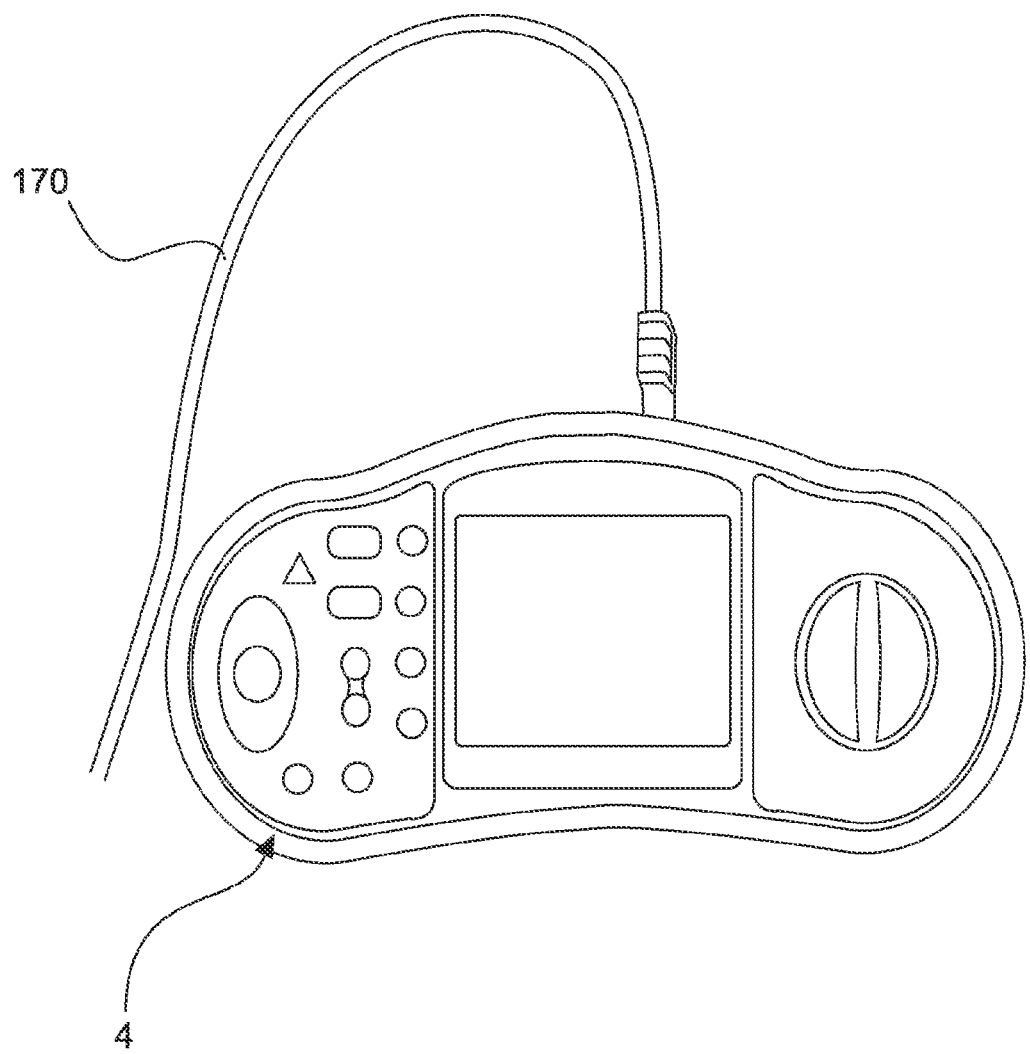

One preferred embodiment of the invention is, by way of example, described by means of the attached figures. The following is shown in FIG. 1: an exemplary embodiment of an unmanned aerial device pursuant to the invention;

FIG. 2: the aerial device pursuant to FIG. 1 in operation during the contacting of the tower of a wind turbine;

FIG. 3: a magnified section of FIG. 1;

FIG. 4: a view of a display device of the camera of the aerial device pursuant to FIG. 1;

FIG. 5: the aerial device pursuant to FIG. 1 in operation during the contacting of a receptor at a rotor blade tip of a wind turbine;

FIG. 6: the display of a display device of the camera of the aerial device during the contacting of the receptor at the rotor blade tip as shown in FIG. 5; and FIG. 7: a resistance, current and or voltage measuring device for use in combination with the aerial device pursuant to FIG. 1.

FIGS. 1 to 3 and 5 show an exemplary unmanned aerial device 1 pursuant to the invention.

The aerial device 1 comprises a contact element 110 with an electrically conductive contact area 111, on which copper wool 112 is arranged. The contact area 111 is arranged essentially vertically and attached to the aerial device 1, in particular the central main body 140, via a connection element with a rod- or respectively bar-shaped configuration, which is arranged essentially horizontally.

Two legs 141 protrude from a central main body 140 of the aerial device 1, which at the bottom end comprise feet 142, on which the aerial device 1 can stand on the ground. Furthermore, four arms 150 protrude from the central main body 140, at which respectively top and bottom rotors 151o,u are arranged. Thus, the aerial device 1 is arranged quadcopter-like and, in addition to climbing and descending and forward movements, can also be kept hovering, as can be seen for example in FIGS. 2 and 5. Thus, the aerial device 1 can fly to different parts of an object, such as a wind turbine 2, and approach surfaces to be contacted, such as lightning protection receptors in different places, for example at the tips 231 of the rotor blades 230, the nacelle 220 or the tower 210 of a wind turbine 2.

To support navigation, an image capturing means 160 in the form of a CCD camera is arranged at the main body 140. As can be seen in FIGS. 4 and 6, in particular, the camera is wirelessly connected to a display device 3 located on the ground and arranged in such a way that it captures the contact element 110 and its immediate vicinity, in particular also an area between the contact area 110 and the object, i.e. in this case, the wind turbine 2. Furthermore, the camera 160 is arranged and configured in such a way that it captures the contact element 110 in a viewing direction essentially in the direction of the connection element 120 or respectively parallel to it, as can also be seen in FIGS. 4 and 6.

The contact element 110 with the contact area 111 equipped with copper wool 112 is connected to the electrically conductive measurement cable 170 in an electrically conductive manner. A second end of this measurement cable 170 remains on the ground during the flight of the aerial device 1. The measurement cable 170 can for example be unspooled from a drum (not shown) during the flight of the aerial device 1.

For the performance of the lightning protection measurement, the second end of the measurement cable 170 is connected to a resistance, current and/or voltage measuring device 4 and/or a grounding contact of the object, in particular the grounding lug at the base of the tower of the wind turbine 2. All in all, a measurement circuit which comprises the lightning protection cable of the wind turbine from the receptor to the grounding contact, or at least a part of it that is to be tested, and in which the resistance, current and or/voltage measuring device 4 is integrated via the measurement cable 170, has to be created.

Thus, the connection between the measurement cable and the lightning protection receptor does not have to be established by maintenance personnel, who, to this end, would have to be abseiled from the nacelle or be brought to the respective lightning protection receptors by means of a working platform. Through the use of the aerial device pursuant to the invention, the personnel can remain on the ground, which is significantly easier, safer and saves time and cost.

REFERENCE NUMBERS

1 Aerial device
110 Contact element
111 Contact area
112 Copper wool
120 Connection element
140 Main body
141 Legs
142 Foot
150, Arms
151o, 151u Rotors
160 Image capturing means
170 Measurement cable
2 Wind turbine
210 Tower
220 Nacelle
230 Rotor blade
231 Tips
3 Display device
4 Resistance, current and/or voltage measuring device

The invention claimed is:

1. An unmanned aerial device for performing a resistance, current and/or voltage measurement at an object, comprising:
    a contact element with an electrically conductive contact area, configured to be brought into contact with a surface of the object, and
    an electrically conductive measurement cable having a first end connected in an electrically conductive manner to the contact area, and a second end configured to be connected to a resistance, current and/or voltage measuring device and/or a grounding contact of the object.

2. The unmanned aerial device according to claim 1, wherein the unmanned aerial device comprises the resistance, current and/or voltage measuring device and the second end of the measurement cable is connected to the resistance, current and/or voltage measuring device.

3. The unmanned aerial device, according to claim 1, further comprising an image capturing means.

4. The unmanned aerial device according to claim 3, wherein the image capturing means is arranged and configured to capture the contact element.

5. The unmanned aerial device according to claim 3, wherein the image capturing means includes a digital or CCD camera.

6. The unmanned aerial device according to claim 1, further comprising:
    at least one flight propulsion unit, and
    an electrical conductor having a first end connected to the at least one flight propulsion unit and a second end configured to be connected to a power supply connection.

7. The unmanned aerial device according to claim 6, wherein the connection between the first end of the electrical conductor and the at least one flight propulsion unit, and/or the connection between the second end of the electrical conductor and the power supply connection is or respectively are configured in a detachable manner.

8. The unmanned aerial device according to claim 6, wherein the connection between the first end of the electrical conductor and the at least one flight propulsion unit, and/or the connection between the second end of the electrical conductor and the power supply connection is or respectively are configured in such a way that the connection(s) will be severed if a predetermined tensile force on the electrical conductor is exceeded.

9. The unmanned aerial device according to claim 1, wherein the connection between the first end of the measurement cable and the contact area, and/or the connection between the second end of the measurement cable and the resistance, current and/or voltage measuring device or respectively the grounding contact of the object is or respectively are configured in a detachable manner.

10. The unmanned aerial device according to claim 1, wherein the connection between the first end of the measurement cable and the contact area, and/or the connection between the second end of the measurement cable and the resistance, current and/or voltage measuring device or respectively the grounding contact of the object is or respectively are configured in such a way that the connection(s) will be severed if a predetermined tensile force on the measurement cable is exceeded.

11. The unmanned aerial device according to claim 1, wherein copper wool is arranged on the contact area.

12. The unmanned aerial device according to claim 1, wherein the contact area is essentially arranged vertically and/or configured concavely.

13. The unmanned aerial device in accordance with claim 1, wherein the contact element is connected to the unmanned aerial device via a connection element which is configured essentially rod-shaped, and wherein the connection element has an essentially horizontal orientation.

14. The unmanned aerial device according to claim 13, wherein the measurement cable runs inside the connection element.

15. The unmanned aerial device according to claim 13, wherein the contact area and/or the contact element is or respectively are attached to the unmanned aerial device and/or to the connection element in a spring-mounted, movable and/or detachable manner.

16. The unmanned aerial device according to claim 13, wherein the connection element is attached to the unmanned aerial device in a spring-mounted, movable and/or detachable manner.

17. The unmanned aerial device according to claim 13, further comprising an image capturing means, wherein the image capturing means is arranged and configured in such a way that it captures the contact element in a viewing direction essentially in the direction of the connection element or parallel to it.

18. The unmanned aerial device according to claim 1, wherein the object includes a lightning protector receptor of a rotor blade, of a nacelle or of a tower of a wind turbine.

19. A method for performing a resistance, current and/or voltage measurement at an object, comprising:
providing an unmanned aerial aerial device comprising a contact element with an electrically conductive contact area configured to be brought into contact with a surface of the object, and an electrically conductive measurement cable having a first end connected in an electrically conductive manner to the contact area, and a second end configured to be connected to a resistance, current and/or voltage measuring device and/or a grounding contact of the object,
connecting the second end of the measurement cable to the resistance, current and/or voltage measuring device and/or the grounding contact of the object,
contacting a surface of the object with the contact area of the contact element by means of controlled flying movements of the unmanned aerial device,
maintaining the contact between the contact area of the contact element and the surface of the object for a predetermined measurement duration, and
measuring the resistance, current and/or voltage.

20. The method according to claim 19, wherein the object includes a lightning protector receptor of a rotor blade, of a nacelle or of a tower of a wind turbine.

* * * * *